United States Patent
Yamazaki et al.

(10) Patent No.: US 9,903,042 B2
(45) Date of Patent: Feb. 27, 2018

(54) METHOD FOR PRODUCING GROUP III NITRIDE SEMICONDUCTOR USING A CRUCIBLE

(71) Applicant: TOYODA GOSEI CO., LTD., Kiyosu-shi (JP)

(72) Inventors: Masateru Yamazaki, Kiyosu (JP); Miki Moriyama, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 127 days.

(21) Appl. No.: 14/958,826

(22) Filed: Dec. 3, 2015

(65) Prior Publication Data
US 2016/0160381 A1    Jun. 9, 2016

(30) Foreign Application Priority Data
Dec. 5, 2014    (JP) .................. 2014-247209

(51) Int. Cl.
*C30B 9/10*    (2006.01)
*C30B 29/40*    (2006.01)

(52) U.S. Cl.
CPC .............. *C30B 9/10* (2013.01); *C30B 29/406* (2013.01)

(58) Field of Classification Search
CPC .... C30B 9/00; C30B 9/04; C30B 9/06; C30B 9/08; C30B 9/10; C30B 9/12; C30B 15/00; C30B 15/10; C30B 19/00; C30B 19/02; C30B 19/04; C30B 29/00; C30B 29/10; C30B 29/40; C30B 29/403; C30B 29/406; C30B 35/00; C30B 35/002; F27B 14/00; F27B 14/06; F27B 14/10; F27B 14/102; F27B 14/104

USPC ... 117/11, 13, 19, 21, 35–36, 54, 64–65, 67, 117/73, 76–79, 200, 206, 208, 900, 937, 117/952

See application file for complete search history.

(56) References Cited

FOREIGN PATENT DOCUMENTS

| JP | 2010-83729 A | | 4/2010 |
| JP | 2011-136898 A | | 7/2011 |
| JP | 20110136898 | * | 7/2011 |
| WO | WO 2010/079655 A1 | | 7/2010 |

OTHER PUBLICATIONS

Chinese Office Action dated Aug. 30, 2017, with an English translation thereof, for appl. No. 201510849405.7.
Japanese Office Action dated Oct. 24, 2017, with an English translation thereof, for appl. No. 2014-247209.

* cited by examiner

*Primary Examiner* — Kenneth A Bratland, Jr.
(74) *Attorney, Agent, or Firm* — McGinn I.P. Law Group, PLLC.

(57) ABSTRACT

An object of the present invention is to suppress macro step growth in the growth of GaN crystal through a flux method. As a crucible for holding a melt when growing a GaN crystal through the Na flux method, the crucible is made of alumina and produced by plaster mold casting. The crucible is used, in which there are alumina grains abnormally grown on the inner walls thereof, and the maximum grain size of the abnormally grown alumina grains is not less than 10 μm. When such a crucible is selected and used, the macro step growth can be suppressed, thereby improving the GaN crystal quality.

6 Claims, 4 Drawing Sheets

METHOD FOR PRODUCING GROUP III NITRIDE SEMICONDUCTOR USING A CRUCIBLE

BACKGROUND OF THE INVENTION

Field of the Invention

The present invention relates to a method for producing a Group III nitride semiconductor through a flux method. More specifically, the method is characterized by a crucible for holding a melt. The present invention also relates to a crucible used when growing the Group III nitride semiconductor through the flux method.

Background Art

The so-called Na flux method is well known as a method for growing a GaN crystal. This method is a technique that can grow GaN at a relatively low pressure of a few MPa and a low temperature of 600° C. to 1,000° C. by introducing nitrogen gas in a molten mixture of Na (sodium) and Ga (gallium).

Japanese Patent Application Laid-Open (kokai) No. 2011-136898 and WO 2010/079655 disclose that in the Na flux method, a crucible for holding a melt and a seed crystal is made of ceramics such as alumina, yttria, and YAG (yttrium-aluminum-garnet).

Japanese Patent Application Laid-Open (kokai) No. 2011-136898 describes that the average grain size of the crucible may preferably be 1 μm to 100 μm on the viewpoint of anti-corrosion property against a flux. Similarly, on the viewpoint, the grain size of the powdery raw material may preferably be 0.1 μm to 10 μm.

WO 2010/079655 describes that alumina or silica is eluted from the crucible made of alumina.

In the growth of GaN through the Na flux method, crystal growth called "macro step growth" which forms a large step of a few μm to a few hundred μm order is observed. In a region of this macro step growth, the amount of melt (such as Na) incorporated into the crystal is increased, resulting in the deterioration of crystal quality.

However, the macro step growth could not be suppressed because the control factor of the macro step growth was unknown.

SUMMARY OF THE INVENTION

In view of the foregoing, an object of the present invention is to provide a method for producing a Group III nitride semiconductor through a flux method, which exhibits improved crystal quality by suppressing the macro step growth.

In one aspect of the present invention, there is provided a method for producing a Group III nitride semiconductor, the method comprising holding a melt of Group III metal dissolved in a flux in a crucible, supplying gases containing nitrogen to the melt, and growing the Group III nitride semiconductor, wherein the crucible is made of alumina, and the crucible is used, in which there are alumina grains abnormally grown in producing the crucible on the inner walls thereof, and the maximum grain size of the abnormally grown alumina grains is not less than 10 μm.

In the present invention, the alumina grain size is defined as the diameter of the circle circumscribing the alumina grain. The maximum grain size is the largest value of the measured alumina grain sizes.

Abnormal grain growth is a phenomenon that alumina grains having a grain size larger than the usual are grown. The present inventors found for the first time through the studies that if the maximum grain size of the abnormally grown alumina grains is not less than 10 μm, the macro step growth is suppressed, thereby improving the crystal quality. More preferably, the maximum grain size is 10 μm to 150 μm, and further preferably, 40 μm to 100 μm. The number density of the abnormally grown alumina grains may be 10 to 10,000 per mm square. The number density exceeding 10,000 per mm square reduces the strength of the crucible, which is not preferable. When the number density is within this range, the macro step growth can be sufficiently suppressed. More preferably, it is 50 to 2,000 per mm square, and further preferably, 100 to 1,000 per mm square.

The crucible may be produced by plaster mold casting. It is because the abnormal growth of alumina grains easily occurs due to contamination of impurities such as Ca from the plaster mold. Moreover, when the crucible is produced by casting, the abnormal growth may be artificially induced by adding impurities such as Ca to a slurry.

In the present invention, Group III metal includes Ga, Al, In, and B. Alkali metals such as Na, K, and Li, or alkali earth metals are used as a flux. Particularly, Na is preferably used. C may be added to the flux to suppress miscellaneous crystal. The growing Group III nitride semiconductor crystal may have any composition ratio, and includes AlGaN, InGaN, AlGaInN, and others as well as GaN. Moreover, n-type Group III nitride semiconductor may be grown by doping with n-type impurities, and p-type Group III nitride semiconductor may be grown by doping with p-type impurities. Ge is mostly used as n-type impurities. However, in the growth of Group III nitride semiconductor by vapor phase epitaxy, Si is mostly used because Group III nitride semiconductor is difficult to grow by doping with Si in the flux method. Further, Mg may be used as p-type impurities.

In the other aspect of the present invention, there is provided a crucible used to hold a melt when growing a Group III nitride semiconductor crystal through a flux method, the crucible is made of alumina, in which there are alumina grains abnormally grown on the inner walls thereof, and the maximum grain size of the abnormally grown alumina grains is not less than 10 μm.

According to the present invention, the macro step growth can be easily suppressed by controlling the grain size of the alumina grains abnormally grown in the crucible to not less than 10 μm, thereby improving the crystal quality. This is because impurities contained in the abnormally grown alumina grains are dissolved in a melt, which affects the crystal growth.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described with reference to the drawings. However, the present invention is not limited to the embodiment.

Firstly, the structure of a crystal growth apparatus 1 used in a method for producing a Group III nitride semiconductor according to Embodiment 1 will next be described with reference to FIG. 1.

Figure 1:
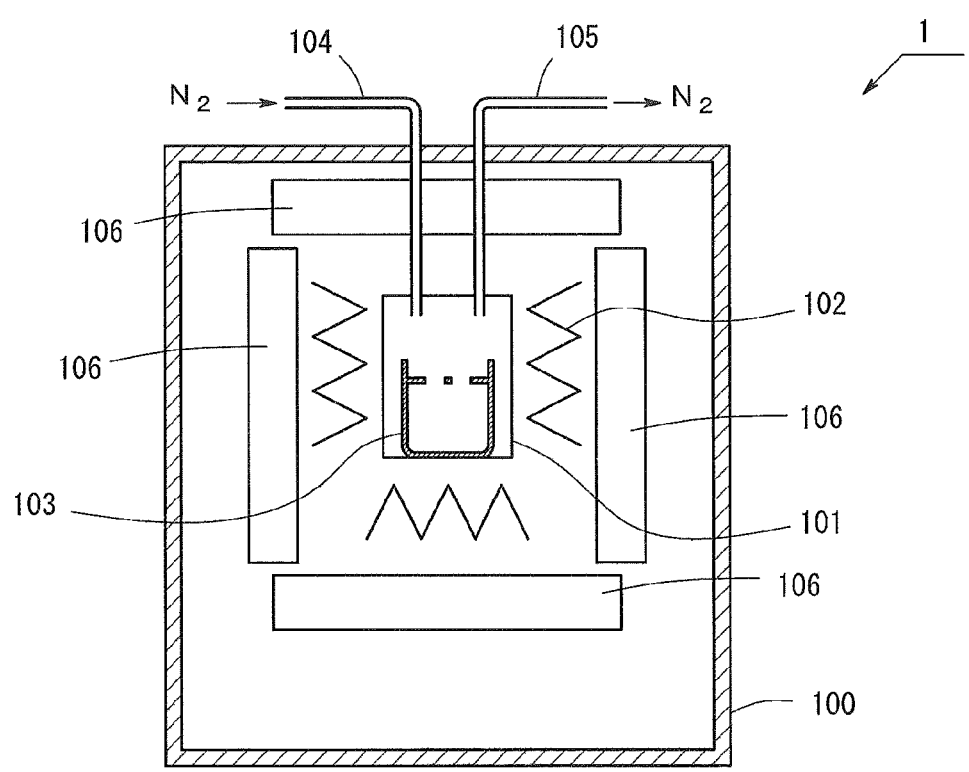
FIG. 1 shows the structure of a crystal growth apparatus 1.

As shown in FIG. 1, the crystal growth apparatus 1 comprises a pressure container 100. The pressure container 100 has a reaction vessel 101 and a heater 102 therein. In the reaction vessel 101, a crucible 103 is disposed. Moreover, in the reaction vessel 101, there is provided a supply pipe 104 for supplying nitrogen gas, and a discharge pipe 105 for discharging nitrogen gas. Further, in the pressure container 100, there is provided an insulating material 106 so as to surround the reaction vessel 101 and the heater 102.

The pressure container 100 is made of stainless and has pressure resistance. The reaction vessel 101 is made of SUS and has heat resistance. The heater 102 heats the reaction vessel 101 through resistance heating, thereby adjusting the growth temperature. Moreover, each of the supply pipe 104 and the discharge pipe 105 connected to the reaction vessel 101, has a valve. The pressure in the reaction vessel 101 is adjusted by adjusting the supply amount and the discharge amount of nitrogen gas with this valve, thereby adjusting the growth pressure.

The crucible 103 is a container holding a seed crystal (GaN free-standing substrate), Na flux, Ga raw material, and other impurities. The crucible 103 has a cylindrical shape with an inner diameter of 59 mm, a height of 36 mm, and a thickness of 3 mm. The crucible 103 is made of alumina ceramics (aluminum oxide sintered compact), and has high heat resistance and alkali resistance. The crucible 103 disposed in the reaction vessel 101 is rotatable by an apparatus not illustrated. The crucible 103 may have a lid. This can prevent evaporation of Na during the GaN growth.

Moreover, the crucible 103 is used, in which there are alumina grains abnormally grown on the inner walls thereof, and the maximum grain size of the abnormally grown alumina grains is not less than 10 μm. The grain size is defined as the diameter of the circle circumscribing the alumina grain. The number density of the abnormally grown alumina grains on the inner walls is 10 to 10,000 grains/mm square (the number of the alumina grains abnormally grown per mm square).

Figure 2:
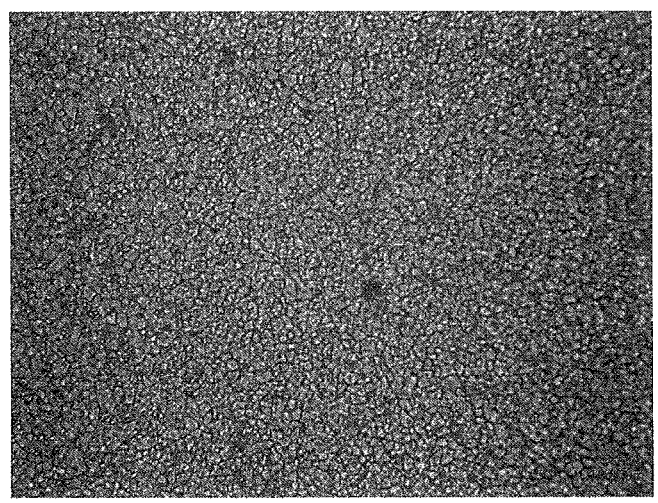
FIG. 2 is a SEM image of normally grown alumina grains.
Figure 3:
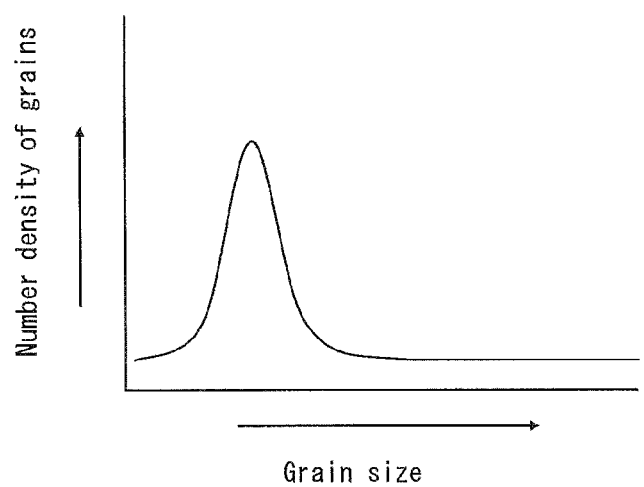
FIG. 3 is a graph showing the number density of grain size distribution when no abnormal grain growth occurs.
Figure 4:
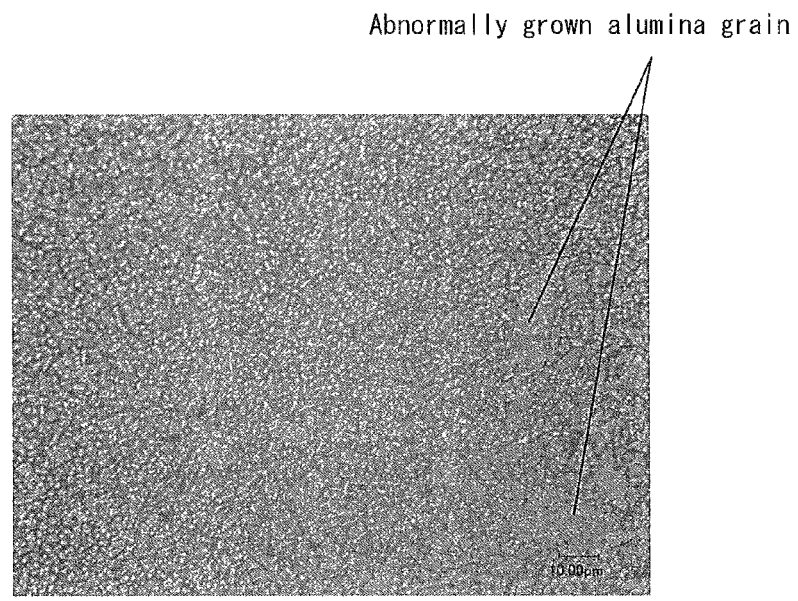
FIG. 4 is a SEM image of abnormally grown alumina grains.
Figure 5:
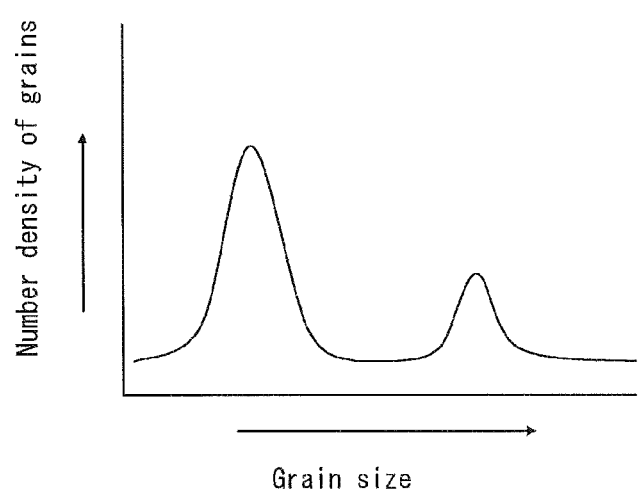
FIG. 5 is a graph showing the number density of grain size distribution when abnormal grain growth occurred.

Here, abnormal grain growth is a growth that produces alumina grains having a grain size larger than the grain size of the normally grown alumina grain (for example, grain size larger by one or more digit order). When the grain sizes of the alumina grains are uniform before sintering, they will be uniform after sintering. However, when abnormal grain growth occurs, alumina grains having a grain size larger than the normal one are produced. When no abnormal grain growth occurs, the alumina grains have an almost uniform grain size and a circular shape (refer to the SEM image of FIG. 2), and the number density of grain size distribution presents one peak mountain (refer to FIG. 3). On the contrary, when abnormal grain growth occurred, alumina grains having a grain size larger than that when no abnormal grain growth occurs are produced (refer to the SEM image of FIG. 4), and the alumina grains have a shape closer to an ellipse shape as well as a circular shape. The number density of grain size distribution presents a grain size peak (first number density peak) of the alumina grains normally grown, and a grain size peak (second number density peak) of the alumina grains abnormally grown at a position of a grain size (second grain size) larger than the grain size (first grain size) of the grain size peak (first number density peak) of the normally grown alumina grains (refer to FIG. 5). As shown in FIG. 5, the grain sizes of the abnormally grown alumina grains are almost uniform.

The crucible 103 produced by plaster mold casting is used. Specifically, the crucible is produced as follows. Firstly, alumina powders are mixed with water to produce a slurry (suspension), and it is poured into a plaster mold. A slurry is produced using a wet jet mill. Thereafter, it is left for a predetermined time to make the plaster mold absorb moisture, and a certain thickness of alumina grains are deposited on the surface of the plaster mold. Subsequently, the liquid slurry remained in the plaster mold is drained off so as to leave only a layer of alumina grains layer deposited on the surface of the plaster mold. The remained layer of alumina grains is dried for a predetermined time and solidified to obtain a molding. Then, the molding is removed from the plaster mold, and sintered in the air at a temperature of 1,570° C. Thus, a crucible 103 being an alumina sintered body, is produced.

In this production method, impurities such as Ca, C, and O are dissolved from the plaster mold into the slurry, and the molding contains these impurities. These impurities are considered to be a cause of abnormal grain growth during sintering.

When the crucible 103 is produced by plaster mold casting, there may be alumina grains abnormally grown. Therefore, from a plurality of crucibles 103 produced by plaster mold casting, the crucible 103 satisfying the following conditions is selected and used in Embodiment 1. The conditions are that the abnormally grown alumina grains are on the inner walls of the crucible 103, and that the maximum grain size of the abnormally grown alumina grains is not less than 10 μm.

The grain size of alumina grains can be easily measured by SEM observation. The maximum grain size is preferably measured by observing the bottom surface of the inner walls of the crucible 103 because the bottom surface of the crucible 103 always contacts a melt. Moreover, when selecting a crucible 103, there is no need to measure the grain sizes of the abnormally grown alumina grains for all the inner walls of the crucible 103, and it is sufficient to measure the grain sizes of the abnormally grown alumina grains in a range randomly selected. For example, a range of 100 μm square or 1 mm square range is randomly selected, and the abnormally grown alumina grains in that range are picked up and measured to select the crucible 103 having the maximum grain size of not less than 10 μm.

When GaN is grown using such a crucible 103 through the Na flux method, as described later, the macro step growth can be suppressed, thereby improving the crystal quality of GaN. To increase the effect of suppressing the macro step growth, the maximum grain size of the alumina grains is preferably 10 μm to 150 μm, and more preferably, 40 μm to 100 μm.

Moreover, such a crucible 103 is preferably used that the number density of the alumina grains abnormally grown on the inner walls (particularly on the bottom surface) thereof is 10 to 10,000 per mm square. Thereby, the macro step growth is suppressed, and a GaN crystal having good crystallinity is obtained. The number density exceeding 10,000 per mm square reduces the strength of the crucible 103, which is not preferable. More preferably, it is 50 to 2,000 per mm square, and further preferably, 100 to 1,000 per mm square.

In the above method, abnormal growth of alumina grains naturally occurs due to contamination of impurities such as Ca from the plaster mold. However, abnormal grain growth may be artificially caused by adding Ca and others to a slurry.

Moreover, the casting conditions may be as follows. The average grain size of the alumina powders when producing a slurry, is preferably 0.1 μm to 1 μm. The alumina grains of the crucible 103 become dense, thereby improving the strength of the crucible.

Although water is employed as a slurry medium, a conventional slurry medium such as alcohol, ketone, and amine may be employed. However, water is preferably employed in terms of absorbability of medium into the mold, environmental load, and no medium remaining in the crucible 103. Moreover, distilled water is preferable in terms of suppressing the contamination of impurities.

Although the plaster mold is used, the mold may be made of any material as long as the mold can absorb the slurry medium, and mix impurities in the slurry. Or when the mold is made of a material from which impurities are hardly dissolved in the slurry, abnormal grain growth may be artificially induced by adding impurities to the slurry. However, the plaster mold is preferably used as the casting mold because it is inexpensive and easy to mix impurities into the slurry.

The sintering temperature of the molding is preferably 1,500° C. to 1,600° C. to make the alumina grains dense and prevent them from being excessively large.

A sintering assistant to promote sintering may be added to the slurry or a dispersant to uniformly disperse alumina grains may be added to the slurry medium. When a dispersant is added, thermal treatment may be performed at a temperature lower than the sintering temperature of the molding to remove the dispersant from the molding before sintering the molding.

The crucible 103 may be produced by the method other than casting as long as abnormal growth of alumina grains can be induced in the crucible 103.

Next will be described the processes for growing n-GaN crystal using a crystal growth apparatus 1 as shown in FIG. 1 through the Na flux method.

Firstly, in a crucible 103, a GaN free-standing substrate having a diameter of 2 inches is disposed as a seed crystal, and then, 11 g Ga, 17 g Na, 50 mg C, and 140 mg Ge are added. Ge is added as an n-type impurity. Moreover, C is added to efficiently incorporate Ge as an n-type impurity in the growing GaN crystal as well as to suppress the growth of miscellaneous crystal and improve the crystallinity. C acts like a catalyst, and is hardly incorporated in the growing GaN crystal so that the C concentration of the crystal is not more than $1 \times 10^{16}/cm^3$.

The above setting work in the crucible 103 is performed in a glovebox filled with inactive gas such as Ar to prevent the mixing of impurities due to oxidation of Na.

The seed crystal is not limited to a GaN free-standing substrate. A template substrate may be employed. The template substrate is produced by growing GaN through MOCVD, HVPE, or MBE on a substrate made of sapphire different from Group III nitride semiconductor. When the GaN free-standing substrate is employed, the thickness is preferably not less than 500 μm at an initial growth stage to prevent the GaN free-standing from disappearing due to meltback. Alternatively, meltback may be prevented by forming an AlGaN layer on the GaN free-standing substrate.

Subsequently, the crucible 103 is heated to a temperature of 845° C. using a heater 102, nitrogen gas is introduced from a supply pipe 104 into a reaction vessel 101, and the pressure of the reaction vessel 101 is set to 3 MPa by controlling the valves of the supply pipe 104 and the discharge pipe 105. This produces a melt of a mixture of Na, Ga, C, and Ge in the crucible 103. When nitrogen is dissolved in a melt to be oversaturated, a Ge doped n-GaN starts to crystal-grow on a seed crystal. This state is kept for 40 hours to grow the Ge-doped n-GaN on the seed crystal. During the growth, the crucible 103 is rotated at 25 rpm, and the rotation direction of the crucible is inverted at predetermined time intervals. Thus, the melt in the crucible 103 is stirred. This is for homogenizing the melt, and improving the crystal quality of the growing n-GaN. As the gas being introduced in the reaction vessel 101, a gas containing N as a constituent element, for example, ammonia may be employed other than an nitrogen gas.

The growth temperature and pressure are not limited to the above values. The temperature is preferably 600° C. to 1,000° C., more preferably, 800° C. to 950° C., and further preferably, 850° C. to 900° C. Moreover, the pressure is preferably 1 MPa to 6 MPa, more preferably, 2 MPa to 5 MPa, and further preferably, 2.5 MPa to 4 MPa.

The crucible 103 made of alumina is used, in which there are alumina grains abnormally grown on the inner walls thereof, and the maximum grain size of the abnormally grown alumina grains is not less than 10 μm. Therefore, in the growth of n-GaN, macro step growth is suppressed.

The reason for suppressing the macro step growth is considered as follows. The crucible 103 is used, which is produced by plaster mold casting and has the alumina grains abnormally grown on the inner walls thereof. This is because abnormal grain growth occurs during sintering due to impurities such as Ca, C, and O dissolved from the plaster mold into the slurry. When there are alumina grains that caused such an abnormal grain growth on the inner walls of the crucible 103, impurities such as Ca, C, and O contained in the abnormally grown alumina grains are dissolved in the melt held in the crucible 103. Such impurities are considered to act to suppress the macro step growth in the growth of GaN. When the maximum grain size of the abnormally grown alumina grains is not less than 10 μm, a sufficient amount of impurities is dissolved in the melt so that the macro step growth is effectively suppressed. This is the reason for suppressing the macro step growth.

In this way, the factor for suppressing the macro step growth is considered as impurities such as Ca contained in the crucible 103. However, the amount of impurities contained in the crucible 103 is difficult to control, and actually it is also difficult to suppress the macro step growth by producing a plurality of crucibles 103, analyzing the amount of impurities, and selecting a crucible 103 based on the amount of impurities. Therefore, as in Embodiment 1, when crucibles 103 having the abnormally grown alumina grains on the inner walls thereof are selected, and a crucible 103 in which the maximum grain size of the abnormally grown alumina grains is not less than 10 μm is further selected from the selected ones, the effect of suppressing the macro step growth is obtained, thereby improving the crystal quality.

Thereafter, heating using the heater 102 is stopped, the supply of nitrogen gas from the supply pipe 104 is stopped, and the temperature and pressure are returned to normal. Then, the n-GaN crystal grown on the GaN free-standing substrate is removed from the crucible 103, and Na adhered to the n-GaN crystal is removed with ethanol. This is the processes for producing n-GaN according to Embodiment 1.

The above-mentioned n-GaN grown on the seed crystal has a Ge concentration of $1\times10^{16}$ to $5\times10^{18}/cm^3$ and a C concentration of $1\times10^{16}/cm^3$ or less, and exhibits good n-type conductivity. Moreover, since the macro step growth is suppressed, the amount of melt such as Na incorporated into the crystal is small, and the crystal quality is high.

The relationship between the density of the crucible 103, the maximum grain size of the abnormally grown alumina grains, and the crystal quality will next be described based on the results of the experiment.

Figure 6:
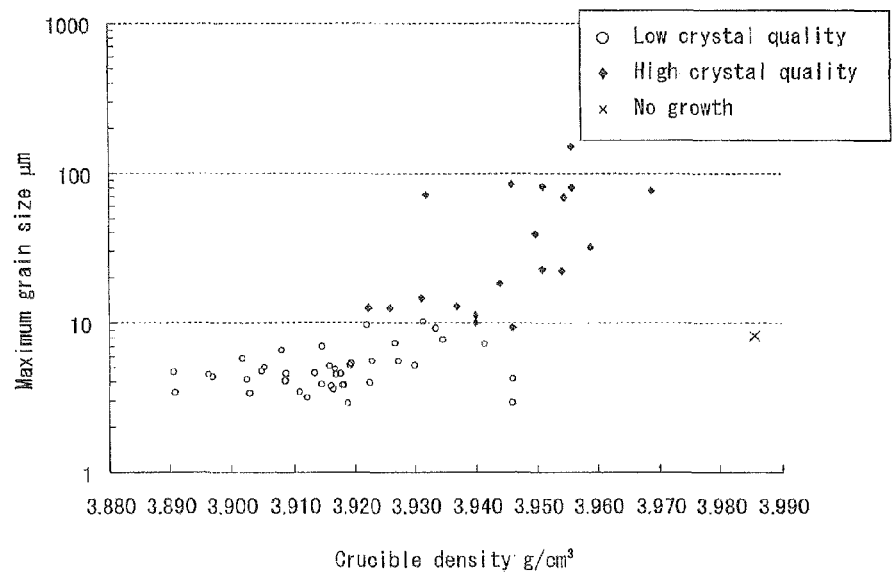
FIG. 6 is a graph showing the relationship between the maximum grain size and the crystal quality.

FIG. 6 is a graph showing the relationship between the density, the maximum grain size of the crucible 103 and the crystal quality. The maximum grain size of the alumina grains is the largest one obtained by observing the bottom surface of the crucible 103 with a SEM. The crystal quality is determined by visually observing the surface of the grown n-GaN. When there is Na incorporated due to macro step growth, the crystallinity is determined low. When there is no Na incorporated, the crystallinity is determined as high.

As shown in FIG. 6, as the density of the crucible 103 increases, the maximum grain size tends to increase. However, it is not necessarily concluded that the crystallinity is high when the density is high. On the other hand, it was found that the crystal quality is high when the maximum grain size of the abnormally grown alumina grains is not less than 10 μm, and the crystal quality is low when it is less than 10 μm. Therefore, the crystal quality can be improved by selecting from a plurality of crucibles 103, the one having the maximum grain size of not less than 10 μm.

Figure 7:
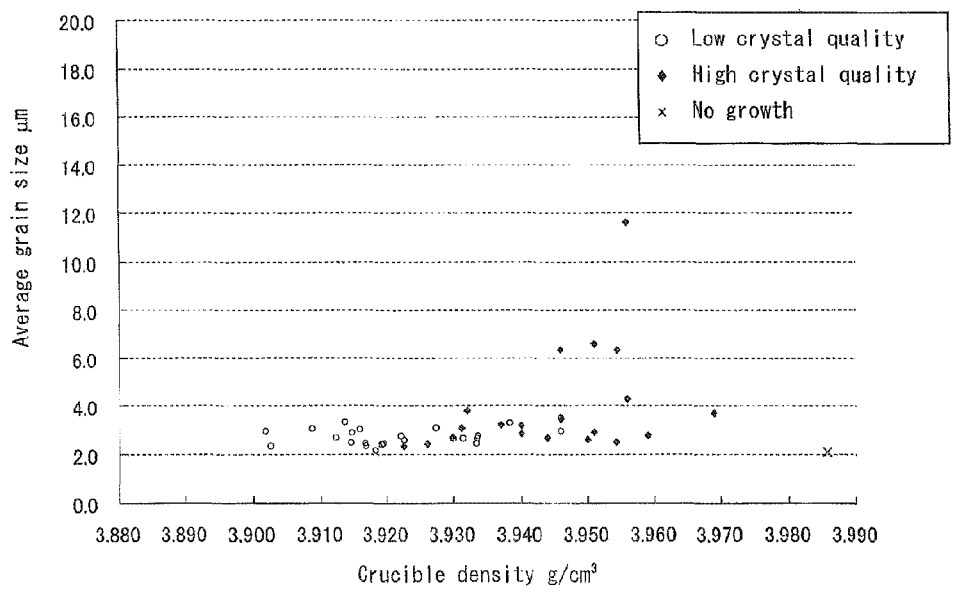
FIG. 7 is a graph showing the relationship between the average grain size and the crystal quality.

FIG. 7 is a graph showing the relationship between the density and the average grain size of the crucible 103 and the crystal quality. The maximum grain size of the alumina grains and the crystal quality were measured in the same way as in FIG. 6. The average grain size is an arithmetic mean value of the alumina grain sizes.

As shown in FIG. 7, the average grain size was in a range of approximately 2 μm to 4 μm regardless of the density. A relation between the average grain size and the crystallinity was not found. This means that the existence of the abnormally grown alumina grains is not outstanding when the average grain size of the alumina grains was taken because the number density of the abnormally grown alumina grains is smaller than that of the normally grown alumina grains. Thus, it was found that the macro step growth cannot be suppressed by selecting a crucible 103 based on the average grain size.

A crucible 103 was produced under the different sintering conditions, in which there are no alumina grains abnormally grown, and all the grains are large (the average grain size is not less than 10 μm). When n-GaN crystal was grown using that crucible 103 through the Na flux method, the crystal quality was low. Japanese Patent Application Laid-Open (kokai) No. 2011-136898 describes that the average grain size of the crucible is preferably 1 μm to 100 μm. However, it was found even if the average grain size is within this range, the crystal quality was not improved when there are no alumina grains abnormally grown.

Variation

In Embodiment 1, the Na flux method using Na as a flux is employed as a method for producing n-GaN. However, it is not limited to this. At least one selected from a group consisting of alkali metals such as Li, Na, and K or alkali earth metals such as Mg, Ca, and Ba may be used as a flux. However, as in Embodiment 1, Na is preferably used as a flux.

Moreover, Embodiment 1 is a method for producing a Ge-doped n-GaN. However, the present invention is not limited to this, and can be applied to a method for producing a Group III nitride semiconductor having any composition ratio. For example, it can be applied to a method for producing an InGaN, an AlGaN, and an AlGaInN. It can be applied to a method for producing a non-doped Group III nitride semiconductor or a Mg-doped p-type Group III nitride semiconductor as well as an n-type Group III nitride semiconductor.

The Group III nitride semiconductor crystal produced by the present invention can be used as a substrate for producing a semiconductor device made of Group III nitride semiconductor.

What is claimed is:

1. A method for producing a Group III nitride semiconductor, the method comprising holding a melt of Group III metal dissolved in a flux in a crucible, supplying gases containing nitrogen to the melt, and growing the Group III nitride semiconductor, wherein the crucible is made of alumina; and the crucible is used, in which there are alumina grains comprising abnormal grains abnormally grown and normal grains normally grown in producing the crucible on the inner walls thereof, wherein a number density of grain size distribution presents a first number density peak at a first grain size with respect to a group of the normal grains and a second number density peak at a second grain size with respect to a group of the abnormal grains, wherein the second number density peak is separated from the first number density peak, and the second grain size is larger than the first grain size, and wherein a maximum grain size of the abnormal grains is not less than 10 μm, the grain size being defined as a diameter of a circle circumscribing the grains.

2. The method for producing a Group III nitride semiconductor according to claim 1, wherein a number density of the group of the abnormal grains is 10 to 10,000 per mm square.

3. The method for producing a Group III nitride semiconductor according to claim 2, wherein a number density of the group of the abnormal grains is 50 to 2,000 per mm square.

4. The method for producing a Group III nitride semiconductor according to claim 1, wherein the crucible is produced by plaster mold casting.

5. The method for producing a Group III nitride semiconductor according to claim 2, wherein the crucible is produced by plaster mold casting.

6. The method for producing a Group III nitride semiconductor according to claim 3, wherein the crucible is produced by plaster mold casting.

* * * * *